(12) United States Patent
Waller (10) Patent No.: US 6,621,759 B1
(45) Date of Patent: Sep. 16, 2003

(54) MEMORY WORDLINE DECODER HAVING SIGNAL-DRIVING AMPLIFIER

(76) Inventor: William K. Waller, 2262 N. Greenview Ct., Eagle, ID (US) 83616

(*) Notice: Subject to any disclaimer, the term of this patent is extended or adjusted under 35 U.S.C. 154(b) by 0 days.

(21) Appl. No.: 10/162,937

(22) Filed: Jun. 6, 2002

(51) Int. Cl.[7] ................................................. G11C 8/00
(52) U.S. Cl. ............. 365/230.06; 365/203; 365/189.06; 365/189.09
(58) Field of Search .......................... 365/230.06, 203, 365/189.06, 189.09, 189.11, 230.03

(56) References Cited

U.S. PATENT DOCUMENTS

| | | | |
|---|---|---|---|
| 5,311,481 A | 5/1994 | Casper et al. | |
| 5,519,665 A | * 5/1996 | Chishiki | ................ 365/230.06 |
| 6,130,855 A | 10/2000 | Keeth | |
| 6,226,218 B1 | 5/2001 | Kim | |
| 6,275,442 B1 | 8/2001 | Hill et al. | |
| 6,324,088 B1 | 11/2001 | Keeth et al. | |

* cited by examiner

Primary Examiner—David Lam (57) ABSTRACT

A wordline decoder circuit for a semiconductor memory device is disclosed, providing a new combination of optimized speed, power, and device area with self-latching wordline output and prevention of process parasitic latch-up. A method for high-speed copying of data from row to row within a memory section is disclosed for reducing time required to stress and to test the device. The wordline decoder circuit as disclosed can implement the row-copy method as disclosed.

11 Claims, 7 Drawing Sheets

MEMORY WORDLINE DECODER HAVING SIGNAL-DRIVING AMPLIFIER

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISK APPENDIX

Not Applicable

BACKGROUND OF THE INVENTION

The present invention relates to integrated circuit memory devices, and specifically to wordline decoders within such devices. Improvements in speed, device area, functionality, test cost, and power consumption are ever important to this field of design.

Semiconductor memory devices are often fabricated in complementary metal oxide semiconductor process, a technology using devices of n-type conductivity and devices of p-type conductivity on the same semiconductor substrate. The current invention discloses a device needing fewer components than prior-art designs to protect against parasitic latch-up, a hazard inherent in this technology.

Substantially half the cost of a high-capacity memory device is due to test and repair needed to guarantee proper operation. The current invention discloses a device and method which significantly speed factory test operations, and which provide improved speed, power consumption and device size.

Figure 1:
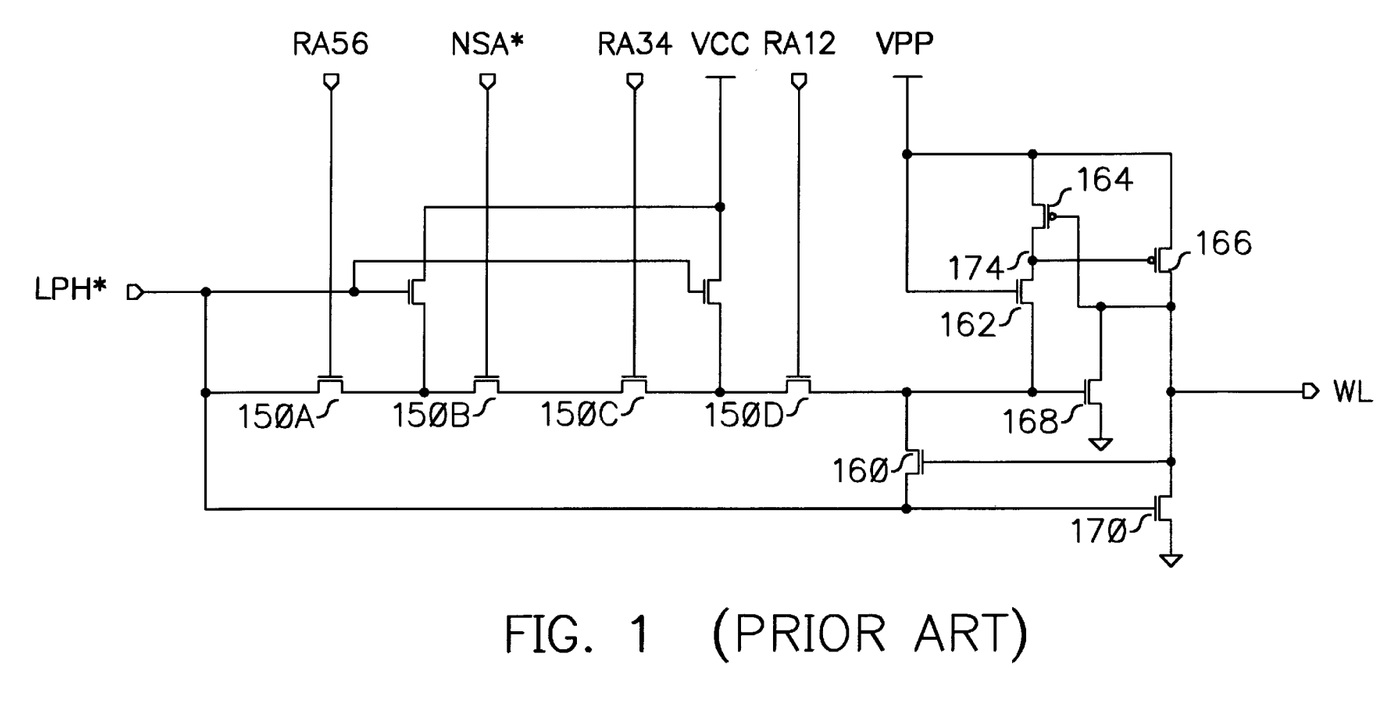
FIG. 1 shows prior-art wordline decoder/driver circuitry taught in U.S. Pat. No. 6,130,855 issued Oct. 10, 2000 to Keeth.

FIG. 1 shows a prior-art wordline decoder as taught by US Pat. No. 6,130,855 "Latching wordline driver for multi-bank memory," issued Oct. 10, 2000 to Keeth. In FIG. 1, clamping transistor 162 is present only to prevent process parasitic latch-up, a condition due to turnon of an unintended parasitic device in complementary metal oxide semiconductor process structures. The condition can draw more current than normal design maximum current and can make the device non-functional until power is removed. The condition can occur in the circuit of FIG. 1 if a drain-to-substrate diode in transistor 164 should become forward biased. When a design has two or more separate voltage supplies, at power-up the supplies will come up to their full voltage at different times. If VCC supply comes up to full voltage before VPP supply, VCC voltage could couple to the drain of transistor 164 while VPP voltage is substantially less than VCC. Since VPP voltage is coupled to the substrate of transistor 164, forward bias of its drain-to-substrate diode would be established by such an event and the resulting current flow can initiate latch-up. Transistor 162 prevents the drain voltage of transistor 164 from exceeding VPP because transistor 162 is off, due to the coupling of a gate of transistor 162 to VPP, whenever VCC voltage exceeds VPP voltage.

Transistor 162 also forms part of the signal path for driving wordline WL high. In order to drive WL high, a logic low voltage level on node LPH* must couple to node 174 through transistor 162, overpowering transistor 164 and pulling node 174 low to turn on pullup driver transistor 166, which then pulls WL high. During this speedcritical transition, the impedance of transistor 162 causes the disadvantage of slowing the circuit without benefiting circuit operation.

In order to counter the slowing effect of transistor 162, four transistors 150A–150D in series between transistor 162 and node LPH* must all be larger in size than they would be if transistor 162 were not 'in the way.' The presence of transistor 162 in the prior-art design of FIG. 1 slows the performance and increases chip size, not just by its own area, but also by the increased size of other transistors. Since every WL has transistor 162, the size penalty associated with transistor 162 is multiplied by the number of rows in the memory array. The size penalty is a disadvantage of the FIG. 1 design.

Also in FIG. 1, the high-to-low transition of wordline WL has a further disadvantage. Transistor 170 overpowers transistor 166 in order to force the transition, which draws useless crossing-current directly from VPP to VSS while both transistors are on. The sequence is as follows. Initially, transistor 166 is turned on, pulling WL high. Input LPH* goes high, turning on transistor 170, starting the crossing-current flow. Transistors 166 and 170 are both on at this point. Transistor 170 then pulls WL low against the pullup of transistor 166. When WL has been pulled low, transistor 160 turns off and transistor 164 turns on, which then pulls up the gate of transistor 166, cutting off the crossing-current only when the gate voltage of transistor 166 has moved within a p-type transistor threshold voltage of VPP supply.

Transistor 166 must be strong enough to quickly pull up the capacitive load of wordline WL, which is very large because typically one thousand or more transistor gates are attached to WL. Because transistor 170 must be strong enough to overpower transistor 166 rapidly while also pulling the very large wordline capacitive load low, transistor 170 requires several times more chip area than necessary. Oversizing transistor 170 places more capacitive load on the LPH* node than necessary, due to increased gate capacitance of transistor 170 arising from its larger size, causing the circuits that drive LPH* to be larger than necessary to obtain high speed, and to use more power than necessary in performing the switching. The area and power penalties of transistor 170 in this design are multiplied by the number of rows in the array as every row has this transistor. The gate-capacitance power penalty for oversizing transistor 170 is paid on both rising and falling transition of WL. Failure to turn off transistor 166 during WL falling transition uses more power than necessary because all the current conducted by the pullup during this transition is used only to fight the needed transition. There is a power penalty because transistor 166 is connected to the high voltage supply VPP, which causes more wasted crossing-current to flow through transistor 170 because VPP is significantly higher VCC, than would be the case if transistor 166 used voltage supply VCC. Wasted VPP current causes extra wasted current in the charge pump which keeps VPP high because the efficiency of the charge-pump itself is at most only 50%. WL turnoff is slower than necessary due to the contention between active pullup and pulldown transistors. Thus this prior art design is slowed unnecessarily, and it consumes more chip area and power than necessary.

Further, the FIG. 1 design has a control signal, NSA*, driving a decoder input. Careful reading of this patent shows that NSA* is the inverse of sense-amplifier enabling signal NSA: when the sense-amplifier is enabled by NSA being high, the wordline decoder is disabled by NSA* being low. Coupling the NSA* signal to decoder input as shown prevents the FIG. 1 design and method from implementing high-speed functions to aid factory test and repair. This is a disadvantage of the FIG. 1 design.

Figure 2:
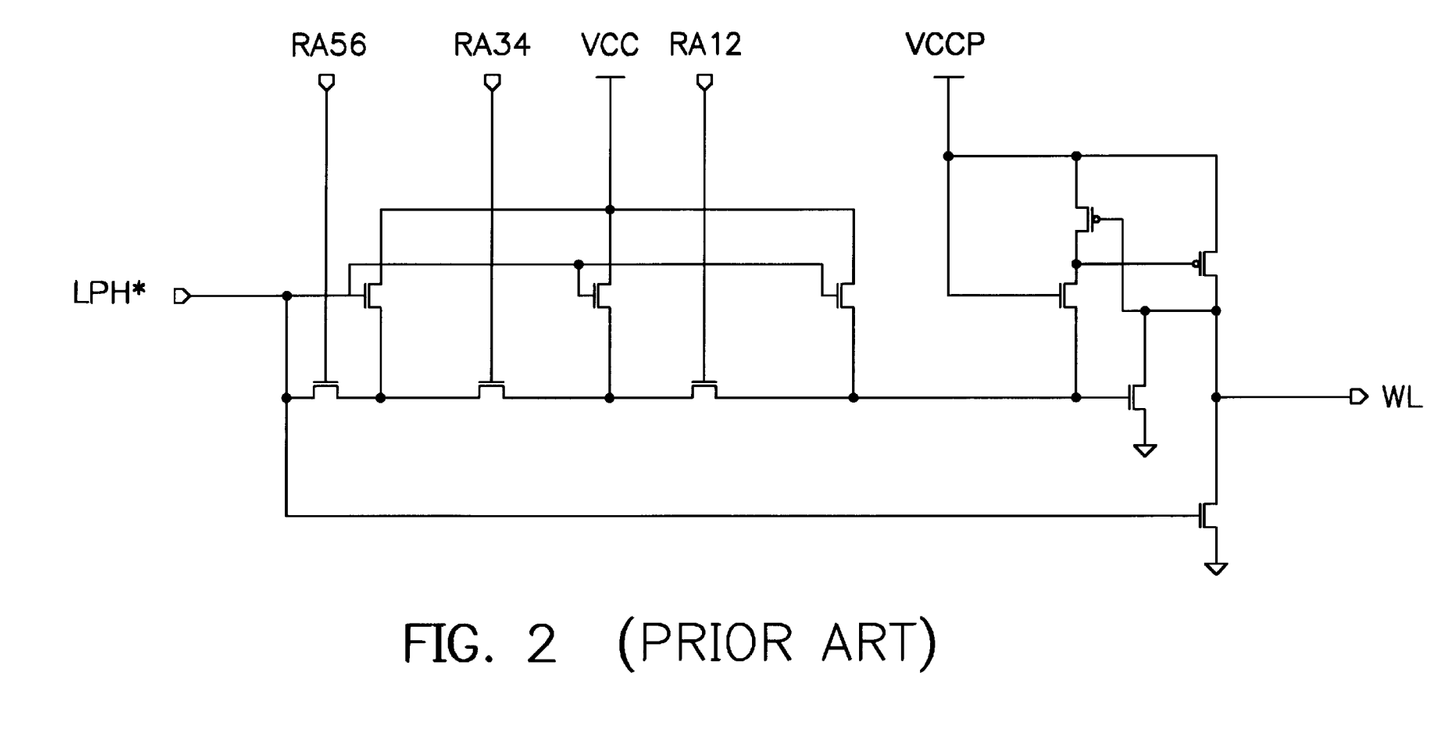
FIG. 2 shows prior-art wordline decoder driver circuitry taught in U.S. Pat. No. 6,324088 issued Nov. 27, 2001 to Keeth.

FIG. 2 shows a prior-art wordline driver as disclosed by U.S. Pat. No. 6,324,088, issued Nov. 27, 2001 to Keeth, et al. This circuit has the same as the FIG. 1 design, with crossing-current due to contention of wordline driver transistors, and with latch-up control that negatively impacts speed, power, and area. Further, the FIG. 2 design does not have wordline latching, and so cannot implement high-speed functions to aid factory test and repair.

Figure 3:
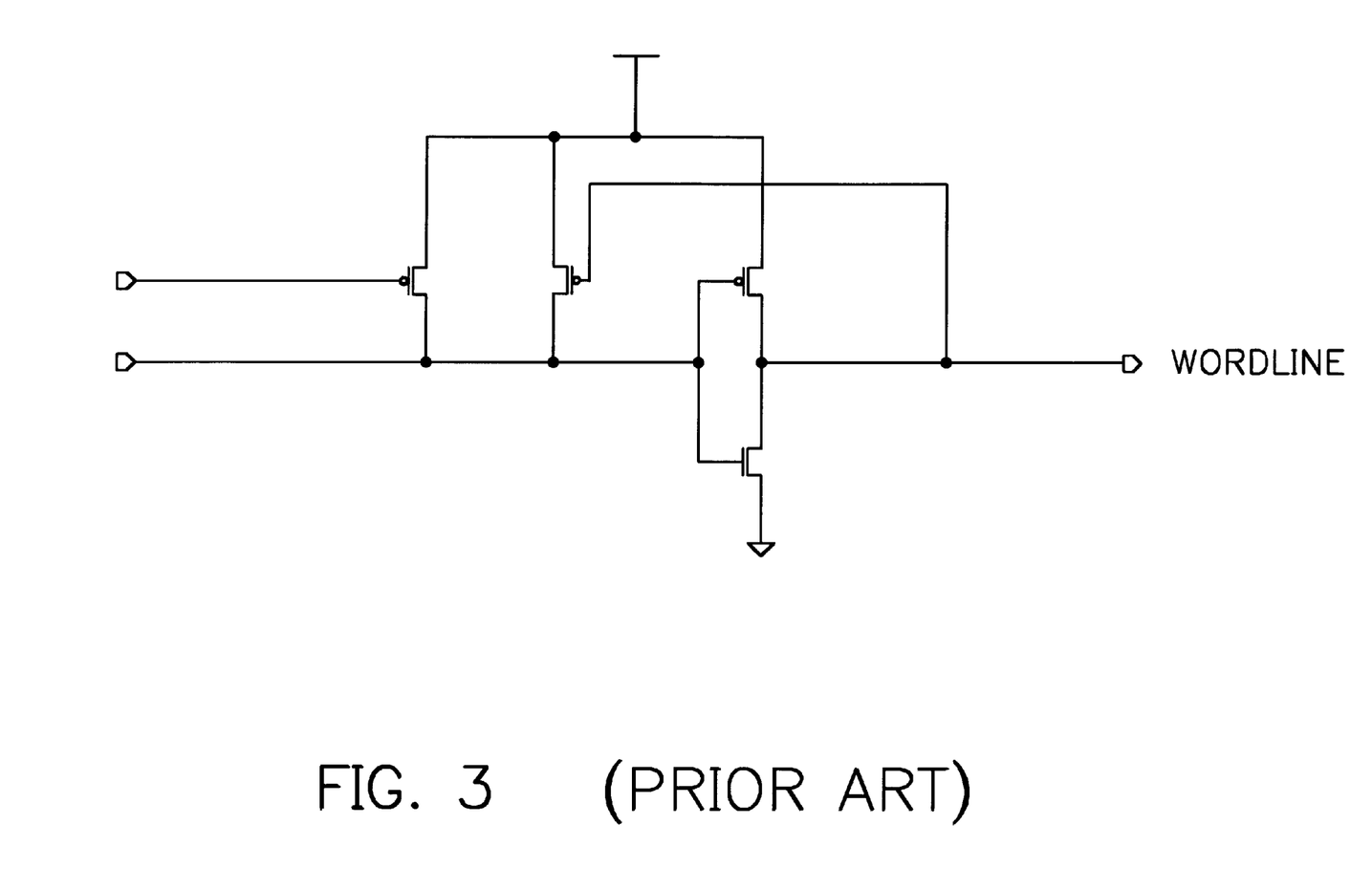
FIG. 3 illustrates prior-art wordline driver circuit as disclosed in U.S. Pat. No. 6,226,218 issued May 1, 2001 to Kim.

FIG. 3 shows a prior-art wordline driver as taught by U.S. Pat. No. 6,226,218 "Row decoder driver for semiconductor memory device," issued May. 1, 2001 to Kim. The design of FIG. 3 fails to address an issue of process parasitic latch-up inherent in high-voltage driver design. Unless the design precludes process parasitic latch-up, the circuit can become locked into an unusable condition by excessive latch-up current. The FIG. 3 design does not have wordline latching, and so cannot implement high-speed functions to aid factory test and repair. These are disadvantages in the FIG. 3 design.

BRIEF SUMMARY OF THE INVENTION

A wordline decoder device for multi-section memory is disclosed, providing a new combination of optimized speed, area, and power, with self-latching wordline signal and exclusion of process parasitic latch-up.

Objects of the current invention are:
(a) Implementing protection against process parasitic latch-up using fewer transistors than prior art, while avoiding latch-up control devices in a critical speed path,
(b) Initiating wordline transitions by overpowering only low-power feedback transistors, not high-power driver transistors, and
(c) Provision of self-latching capability for the signal on the wordline node.

Advantages of the current invention include
(a) a dramatic reduction in the number of transistors used to protect against process parasitic latch-up, providing significant savings in device area and power over prior art designs,
(b) speed improvements over prior art by relocating transistors used to protect against process parasitic latch-up so that they are not in a speed-critical path,
(c) area improvements over prior art by relocating transistors used to protect against process parasitic latch-up so that they are not in a speed-critical path, because no components need to be oversized to maintain device speed,
(d) speed, power, and area improvements over prior art by avoiding any need to overpower large driver transistors during wordline switching, and
(e) a device with self-latching output wordline that supports a new high-speed method for copying data from row to row during factory test and repair.

DETAILED DESCRIPTION OF THE INVENTION

A memory device comprises an array of memory cells with support circuitry for read, write, test and repair. The array of memory cells is divided into a plurality of banks. Each bank is divided into a plurality of sections, each section being separately enabled by a section node. Each section comprises a plurality of rows of memory cells, each row of memory cells being enabled for access by a wordline node coupled to all memory cells in the row. The current invention controls the wordline node for a row of memory cells.

Figure 4:
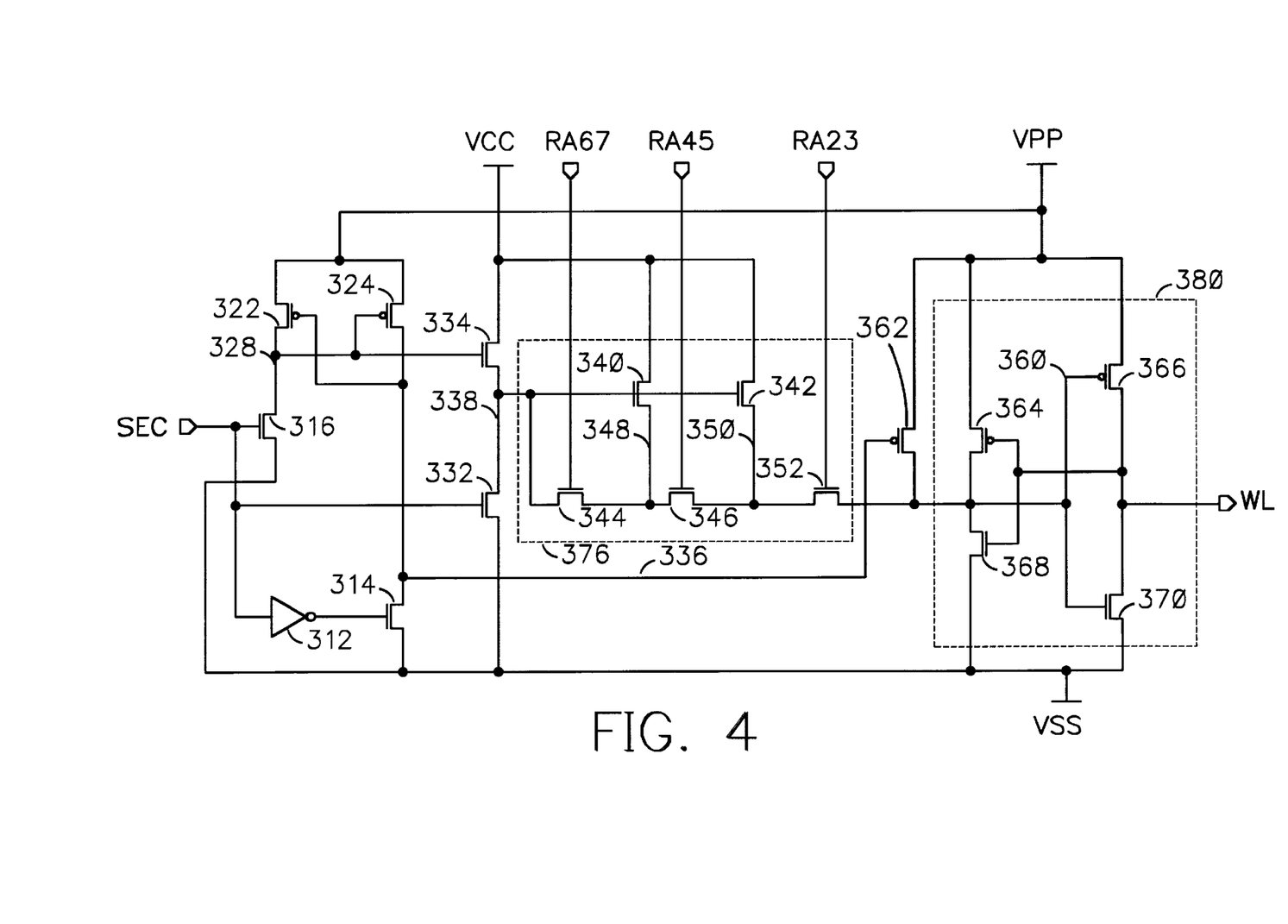
FIG. 4 shows the preferred embodiment of the current invention.

FIG. 4 shows a preferred embodiment of the current invention. This design solves disadvantages of the designs shown in FIGS. 1 and 2, by removing a transistor from the critical speed path for every wordline and implementing the function of removed transistors with a single transistor per section in a non-critical signal path, and by removing contention between active pullup and pulldown wordline driver transistors, enabling improved speed, power, and area. The current invention solves the disadvantages shown in FIGS. 2 and 3 by adding output latching functionality. The current invention solves disadvantages in the designs of FIGS. 1, 2, and 3 by providing protection against process parasitic latch-up having optimized speed, area, and power consumption.

The current invention will be described as shown in FIG. 4. Logic input nodes comprise a section node SEC and a plurality of row address nodes RA23, RA45, and RA67. A wordline node WL comprises the Output. Power-supply connections are a positive supply voltage VCC, a pumped voltage VPP, and a return supply voltage VSS. The VSS supply is normally, but not necessarily, at ground voltage, so long as it is sufficiently negative with respect to VCC and VPP.

The wordline node WL comprises the output of a signal-driving amplifier 380. The wordline node WL couples to the drains of transistors 366 and 370, and to the gates of transistors 364 and 368. The signal-driving amplifier comprises transistors 366, 370, 364 and 368. Driver-gate. node 360 comprises the input of the signal-driving amplifier, and couples the gates of transistors 366 and 370 together and to the drains of transistors 364, 368, 362, and 352. The gate of transistor 362 is coupled to node 336. Source contacts of transistors 362, 364, and 366 couple to the pumped voltage VPP. Source contacts of transistors 368 and 370 couple to the VSS voltage supply.

Transistor 346 and transistor 344 form a series-connected signal path with transistor 352, between driver-gate node 360 and node 338. The gates of transistors 352, 346, and 344 are coupled to row address nodes RA23, RA45, and RA67 respectively, so that these transistors comprise a logic gate 376 decoding the row address nodes. As shown, three transistors decode three nodes, but more or fewer transistors may be used to decode more or fewer nodes. Transistor 352 has its drain coupled to driver-gate node 360, and its source coupled to trapped node 350. Transistor 346 has its drain coupled to trapped node 350 and its source coupled to trapped node 348. Transistor 344 has its drain coupled to trapped node 348 and its source to node 338. Transistor 342 has its source contact coupled to trapped node 350, its drain contact coupled to the VCC supply, and its gate contact coupled to node 338. Transistor 340 has its source contact coupled to trapped node 348, its drain contact coupled to the VCC supply, and its gate contact coupled to node 338.

Transistors 332 and 334 comprise an n-channel inverter. Transistor 332 has its drain coupled to node 338, its gate coupled to the section node SEC, and its source coupled to the VSS supply. Transistor 334 has its drain coupled to VCC supply, its gate coupled to node 328, and its source coupled to node 338.

Transistors 322, 324, 316, and 314, together with inverter 312, comprise a voltage translation circuit. Transistor 322 and transistor 324 each have their source contact coupled to pumped voltage VPP. Transistor 324 and transistor 314 each have their drain contact coupled to node 336. Node 336 also couples to the gate contact of transistor 322. The drains of transistors 316 and 322 couple to node 328. Node 328 further couples to a gate of transistor 324. Transistor 314 and transistor 316 have their source contacts coupled to the VSS supply. The gate of transistor 316 is coupled to the section node SEC. The gate of transistor 314 is coupled to the output of an inverter 312. The input of inverter 312 is coupled to the section node SEC.

The current invention allows particularly rapid copying of data stored in a whole row of memory cells, or in a portion or portions of a row, from one row to another within a section of the memory array. This high-speed copying of data from row to row provides significant reduction in time required to stress and to test the memory during manufacturing quality assurance operations. The method of the current invention provides competitive advantage by significantly reducing a major cost component of memory manufacturing.

Control of parasitic latch-up is designed into the current invention by preventing the coupling of supply voltage VCC to the drain contact of any p-type transistor unless pumped voltage VPP exceeds supply voltage VCC. A clamping transistor is used when a possible conducting path exists to couple VCC to a p-type transistor drain. In complementary metal oxide semiconductor technology, a conducting path exists through a device only between the source and the drain of the device when the device is activated. In FIG. 4, the drain contacts of p-type transistors 322 and 324 can be pulled high only by pumped voltage VPP because supply voltage VCC has no conducting path to these transistors. P-type transistors 362 and 364 do have a conductive path from supply voltage VCC to their drains, but this path is blocked by clamping transistor 334 unless pumped voltage VPP, which is coupled to the gate of transistor 334 when SEC is low, is higher than supply voltage VCC and only then is transistor 334 activated. Transistor 366, the only remaining p-type transistor, is isolated from supply voltage VCC because there is no conducting path from supply voltage VCC to the drain contact of this transistor.

In FIG. 4, nodes 336 and 338 can be driven by one circuit for an entire section. In the current invention therefore, clamping transistor 334 appears only once per section, instead of once for every wordline as in the prior art. In a modern design there can be over a thousand wordlines per section, so the current invention provides in this case substantially a thousand-fold savings per section, in transistors required for latch-up protection. For each transistor obviated by the current invention, its contacts and associated wiring are also made unnecessary. There are hundreds of sections in a modern memory, with more added each new design generation. Thus significant savings in physical device size are realized by the latch-up protection design of the current invention while providing essential functionality.

OPERATION OF THE INVENTION

The circuit of the current invention as shown in FIG. 4 functions by driving the wordline node WL high to enable an associated row of cells in a memory array, when the section node SEC is high and the row address nodes are all high. Once driven high, WL is latched high so that it remains high during any subsequent changes in address values, that is, the set of logic signals on the row address nodes, until SEC switches low. When SEC is low, the wordline node WL is forced low. These functions are accomplished as follows.

Transistor 366 and transistor 370 form an inverter which is part of the signal-driving amplifier. When driver-gate node 360 is logically active low, the inverter sends WL high, enabling access to the associated memory row. Conversely, when driver-gate node 360 is high, WL will be driven low, disabling access to the associated memory row. Transistors 364 and 368, having gates coupled to WL, are each a feedback device serving to latch WL low and high respectively. Transistor 362 acts as a turnoff device which, when activated, drives WL low by switching driver-gate node 360 high.

In the present invention, the sequence of events which results in sending WL high is as follows. The section node must have a logic high value to enable the circuit, driving three separate paths:

1. High level on SEC is inverted by inverter 312 to apply a low logic level to the gate of transistor 314, turning off transistor 314, thus releasing the signal on node 336 from active coupling to VSS.
2. High level on SEC turns on transistor 316, which couples the signal on node 328 to logic low, turning off transistor 334 and activating transistor 324. Then transistor 324 couples node 336 high, turning off transistors 322 and 362. With transistor 362 off, driver-gate node 360 loses its strong pullup to VPP, but weak transistor 364 remains on, keeping driver-gate node 360 high unless and until node 360 may be coupled to a logic low value by series transistor devices 352, 346 and 344, overpowering weak transistor 364. When transistor 334 turns off, the signal on node 338 loses its coupling to logic high and may now be pulled low by activating transistor 332.
3. High logic level on SEC turns on transistor 332, switching the voltage of node 338 low. When node 338 is a logic low, the three series transistors 352, 346, and 344 are in a position to switch driver-gate node 360 low if the row address nodes on the gates of the three transistors are all high, thus activating these three transistors. When all three series transistors are activated, driver-gate node 360 is coupled to the low value on node 338 and so node 360 will be switched low, thus switching WL high via the inverting function of the signal-driving amplifier.

When WL has been driven high, its coupling to the gate of transistor 368 keeps transistor 368 on, holding driver-gate node 360 low during any subsequent changes in row address nodes, thus latching WL high until SEC switches low.

To switch WL low, SEC must fall to a logic low value. The low level on SEC drives three separate paths, as follows.
1. Low level on SEC turns off transistor 316, freeing the signal on node 328 from its active coupling to VSS.
2. Low level on SEC turns off transistor 332, freeing the signal on node 338 from its active coupling to VSS.
3. Low level on SEC is inverted (by inverter 312) to drive a high level onto gate of transistor 314, which turns on and couples node 336 low. Low level on node 336 activates the turnoff device, transistor 362, which couples driver-gate node 360 high, to VPP, overpowering weak latching transistor 368, and driving WL low via the inversion of the signal-driving amplifier as described. Low level on WL turns off transistor 368 and turns on transistor 364, latching high state on driver-gate node 360 and low state on WL. Low level on node 336 also activates transistor 322, which pulls node 328 up to VPP. The high level on node 328 turns off transistor 324 and turns on transistor 334, which pulls node 338 high. The high level on node 338 shifts the voltage level of the source contact of transistor 344 from VSS to VCC, thus ending the pull-down action of these transistors on driver-gate node 360. The high level on node 338 also turns on transistors 340 and 342, coupling trapped nodes 348 and 350 high.

The voltage translation circuit and the n-channel inverter together comprise a control circuit that functions to switch node 338 between VCC and VSS responsive to the SEC node, to activate the turnoff device by switching node 336 between VPP and VSS responsive to the SEC node, and to prevent parasitic latch-up with a single clamping device, transistor 334. Because the SEC node is common to all wordlines in a section, the control circuit only needs to be implemented once per section to serve these functions for all wordlines in a section.

FIGS. 5—7 ALTERNATIVE EMBODIMENTS

Figure 5:
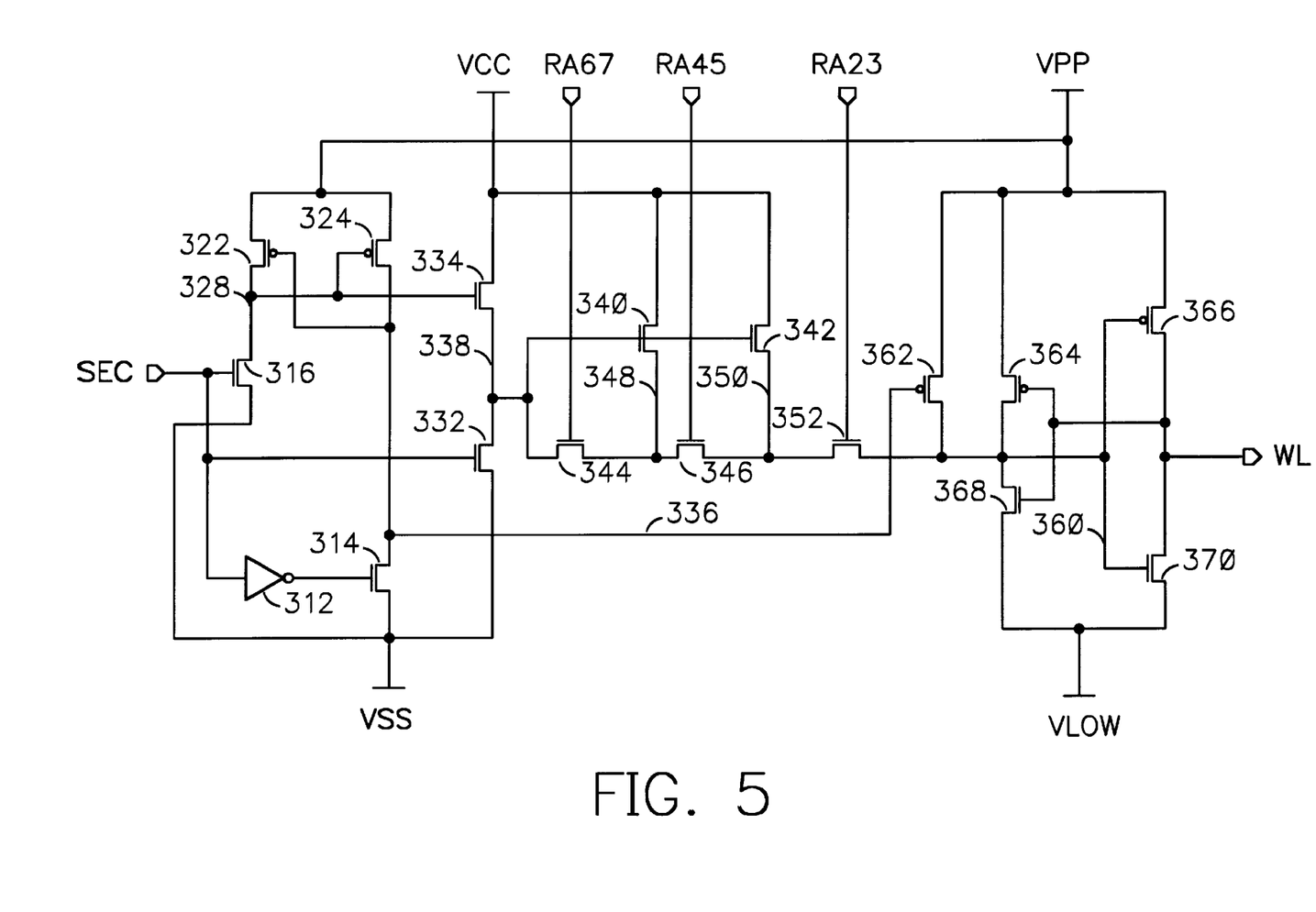
FIG. 5 shows an alternative embodiment of the current invention having low-voltage supply VLOW replacing the VSS supply voltage in the signal-driving amplifier.
Figure 6:
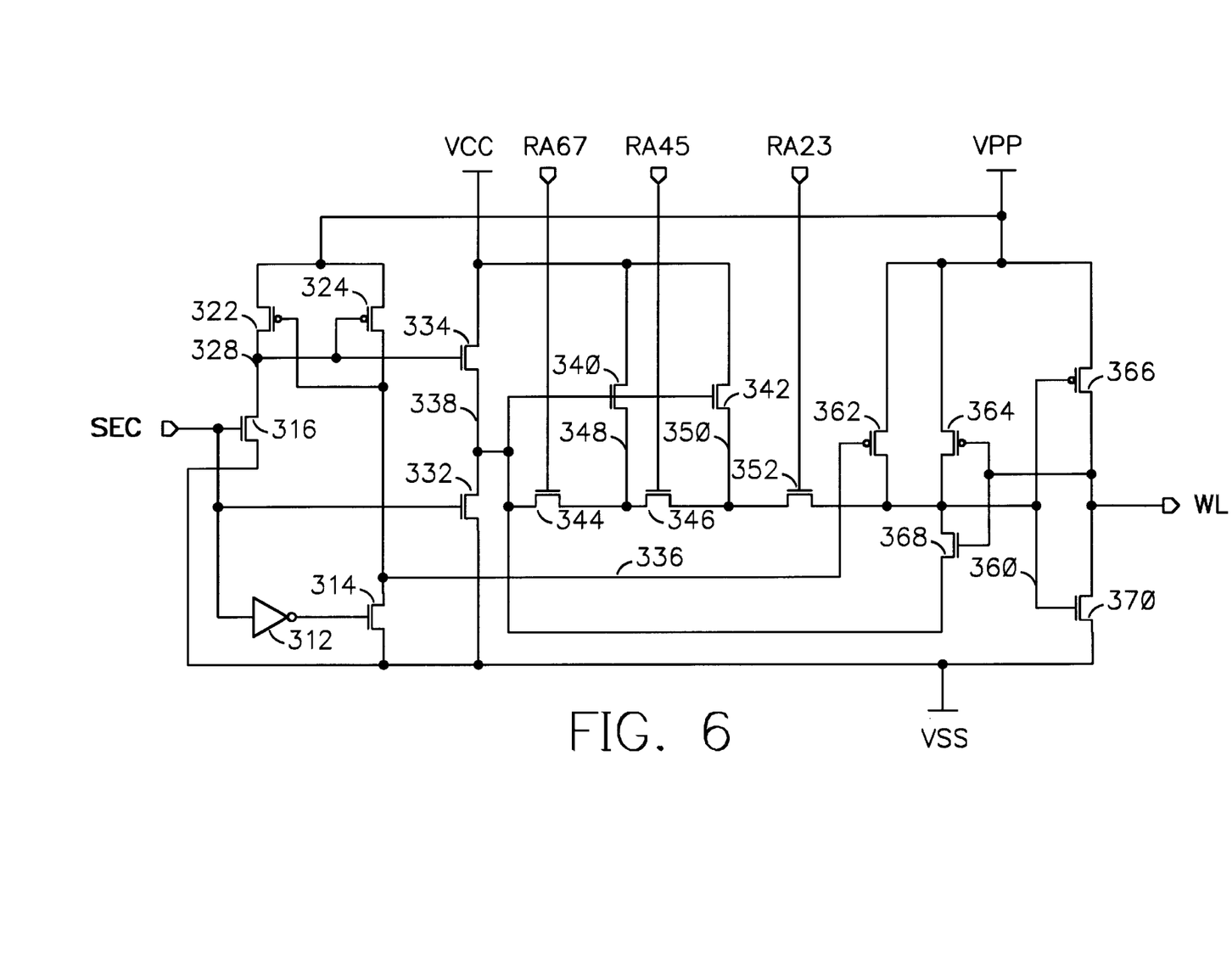
FIG. 6 shows an alternative embodiment of the current invention with a different connection to logic low for latching transistor 368.
Figure 7:
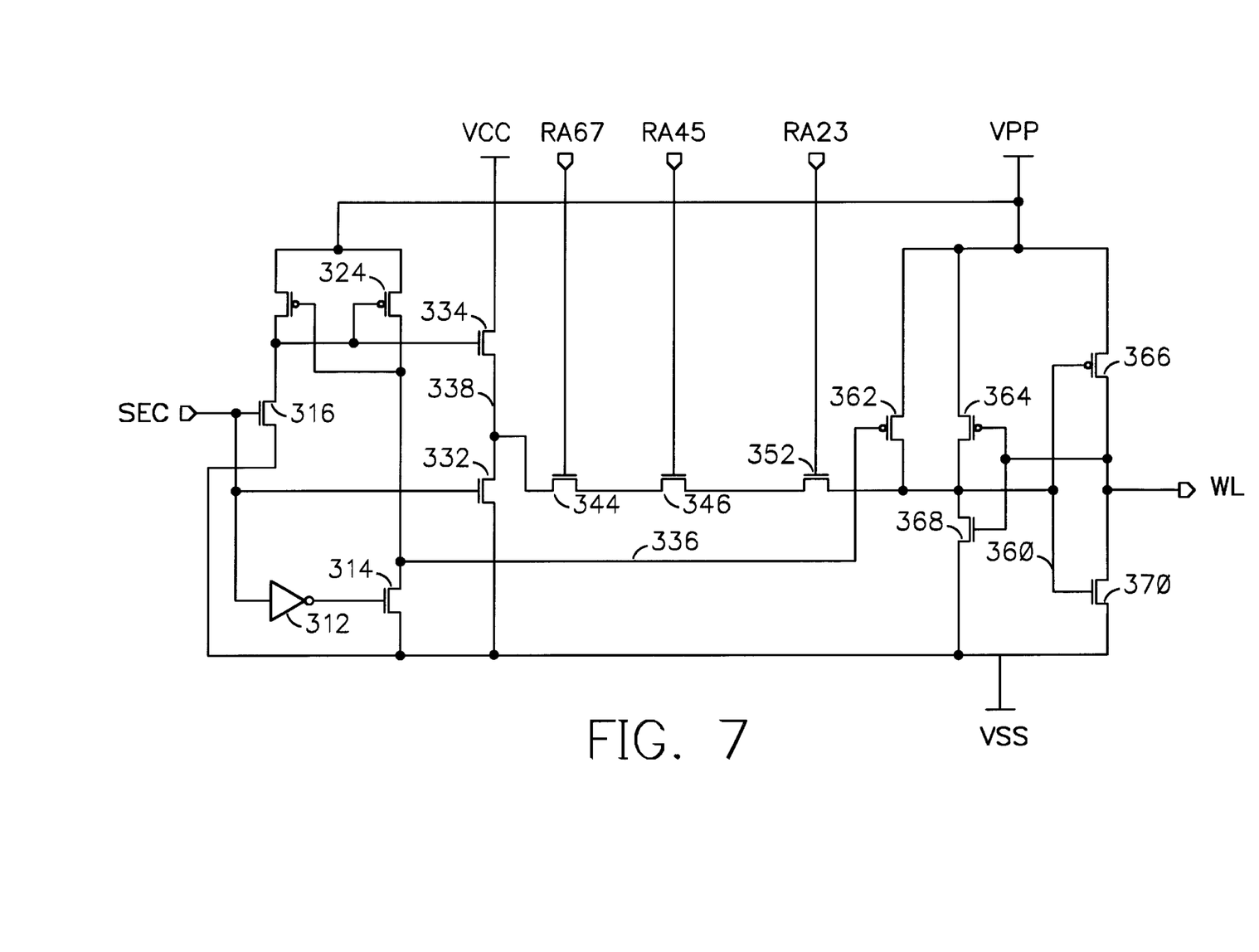
FIG. 7 shows an alternative embodiment of the current invention using fewer transistors. The reason this is not the preferred embodiment is that there is some compromise of design safety by not using the transistors that were removed.

The alternative embodiments shown in FIGS. 5–7 are variations of the FIG. 4 circuit, as follows.

In FIG. 5, source contacts of transistors 368 and 370 couple to a negatively pumped voltage supply, VLOW.

In FIG. 6, the source connection for transistor 368 has been moved from VSS to node 338. This forms an acceptable alternative connection for transistor 368 without changing the overall functionality of the circuit.

In FIG. 7, transistors 340 and 342 have been removed. This alternative relies on the strength of transistor 362 to hold driver-gate node 360 high against any trapped negative charge which may be conducted to node 360 when transistor 352 turns on due to a rising edge on row address node RA23, or when transistors 346 and 352 turn on due to rising edges on row address nodes RA23 and RA45 occurring substantially at the same time.

I claim:

1. A device for access of a row of memory cells within a section of a memory device, there being a plurality of rows of memory cells within the section, there being a single section node associated with all rows of memory cells within the section, by setting logically active a wordline node coupled to the row of memory cells, the device also disabling access to the row of memory cells by setting the wordline node logically inactive, comprising:
   (a) first means including a logic gate, for setting a driver-gate node logically active in response to logically active values of a section node and each of a plurality of row address nodes,
   (b) second means including a turnoff device, for setting the driver-gate node logically inactive when the section node is logically inactive, and
   (c) third means including a signal-driving amplifier, for setting the wordline node to one of two logic values, the signal-driving amplifier setting the wordline node logically active when the driver-gate node is logically active, the signal-driving amplifier setting the wordline node logically inactive when the driver-gate node is logically inactive, the signal-driving amplifier using only devices which actively control the wordline node, the signal-driving amplifier coupling a signal on the wordline node to activate a first feedback device when the wordline node is logically active, the first feedback device when activated holding the driver-gate node logically active during any subsequent changes in the row address nodes, the signal-driving amplifier coupling the signal on the wordline node to activate a second feedback device when the wordline node is logically inactive, the second feedback device when activated holding the driver-gate node logically inactive until the driver gate node is coupled logically active by the logic gate.

2. The device of claim 1 fabricated in a complementary metal oxide semiconductor process, in which the positive voltage used to power the signal driving amplifier may be higher than the positive voltage used to power the logic gate, with fourth means including as few as one control circuit per memory section, for coupling a signal on the section node to the logic gate, for coupling the signal on the section node to the turnoff device, and when more than one positive voltage is used to power the device, for preventing process parasitic latch-up with as few as one clamping transistor per memory section by preventing the voltage of a drain contact of each and every one of a plurality of p-type transistors in the device from becoming more positive than the voltage of a semiconducting substrate in which the p-type transistors are fabricated, there being a plurality of wordlines per memory section.

3. The device of claim 1 wherein the logic gate of the first means comprises series-connected devices.

4. The device of claim 1 wherein the third means comprises cross-coupled inverters.

5. The device of claim 1 wherein the first means comprises a plurality of series-connected devices each having a control node coupled to a separate one of the row address nodes, the series-connected devices forming a path coupling the driver-gate node logically active when the section node and all the row address nodes are logically active.

6. The device of claim 1 wherein the logic gate of the first means comprises a plurality of series-connected transistors each having a gate, and each gate coupled to a different one of the row address nodes, the series-connected transistors forming a conducting path coupling the driver-gate node logically active when the section node and all the row address nodes are logically active.

7. The device of claim 1 wherein the turnoff device of the second means comprises a pullup transistor which, when activated in response to the section node being logically inactive, couples the driver-gate node logically inactive.

8. A method for copying data from row to row in a section of a memory array, the memory array being divided into sections, each section having an associated section node and a plurality of sense amplifiers, each section comprising a plurality of rows of memory cells, each row of memory cells being enabled for access by a dedicated wordline node being logically active, the wordline node being set logically active in response to the section node and a plurality of row address nodes all being logically active, the wordline node upon switching logically active being latched logically active during any subsequent changes in the row address nodes until the section node changes to a logically inactive value, the wordline node being set logically inactive when the section node is logically inactive, comprising the steps of:

(a) setting the section node logically active such that at least one section of the memory is enabled for access, and retaining the section node logically active, while (b) enabling the sense amplifiers associated with the enabled section of the memory, and (c) within the enabled section of the memory, setting a plurality of row address nodes logically active such that an associated wordline node is set and latched logically active, thus enabling access to an associated row of memory cells, and (d) writing a plurality of data values to a plurality of chosen memory cells within the associated row of memory cells, one data value to each chosen memory cell, and (e) setting a plurality of predetermined new address values onto the row address nodes, one new address value after another, while keeping the sense amplifiers enabled, such that each of the new address values occurs once, each of the new address values being stabilized and retained substantially for sufficient time to set an associated new wordline node logically active to enable an associated new row of memory cells for access and to reliably write the associated new row of memory cells, previously enabled rows of memory cells within the section of the memory remaining enabled by the latching function of the current method while the row address values are changed, thus providing and propagating the data values to all chosen memory cells in each associated new row of memory cells simultaneously, thereby writing the data values to all predetermined rows of memory cells one after another essentially as rapidly as the set of new address values may be presented, and finally (f) setting the section node logically inactive, thus disabling further access to all rows of memory cells associated with the section node, thereby completing the operation of writing data values to chosen memory cells in predetermined rows of memory cells with a single enabling of the sense amplifiers for the enabled section of memory.

9. The method of claim 8, wherein at least one of the row address nodes is responsive to a control signal such that the row address node so regulated cannot be set logically active until both its row address signal and the control signal are logically active, the control signal thus regulating a time for enabling each wordline.

10. A device which implements the method of claim 8, for access of a row of memory cells within a section of a memory device, there being a plurality of rows of memory cells within the section, there being a single section node associated with all rows of memory cells within the section, by setting logically active a wordline node coupled to the row of memory cells, the device also disabling access to the row of memory cells by setting the wordline node logically inactive, comprising:

(a) first means including a logic gate, for setting a driver-gate node logically active in response to logically active values of a section node and each of a plurality of row address nodes, (b) second means including a turnoff device, for setting the driver-gate node logically inactive when the section node is logically inactive, and (c) third means including a signal-driving amplifier, for setting the wordline node to one of two logic values, the signal-driving amplifier setting the wordline node logically active when the driver-gate node is logically active, the signal-driving amplifier setting the wordline node logically inactive when the driver-gate node is logically inactive, the signal-driving amplifier using only devices which actively control the wordline node, the signal-driving amplifier coupling a signal on the wordline node to activate a first feedback device when the wordline node is logically active, the first feedback device when activated holding the driver-gate node logically active during any subsequent changes in the row address nodes, the signal-driving amplifier coupling the signal on the wordline node to activate a second feedback device when the wordline node is logically inactive, the second feedback device when activated holding the driver-gate node logically inactive until the driver gate node is coupled logically active by the logic gate.

11. A device for accessing a row of memory cells within an array of memory cells, by setting and latching logically active a wordline node coupled to the row of memory cells, the device also disabling access to the row of memory cells by setting and latching the wordline node logically inactive, comprising:

an output wordline node, input nodes comprising a section node and a plurality of row address nodes, power-supply connections comprising a chip supply voltage, a pumped supply voltage, and a common supply voltage, the wordline node coupling to the output of a signal-driving amplifier comprising a drain contact of a first transistor and a drain contact of a second transistor, the signal-driving amplifier comprising the first transistor and the second transistor and a driver-gate node, the driver-gate node coupling a gate contact of the first transistor and a gate contact of the second transistor, the signal-driving amplifier further comprising a third transistor and a fourth transistor, the wordline node also coupling to a gate of the third transistor and to a gate of the fourth transistor, the driver-gate node also coupling to a drain of each of the third transistor, the fourth transistor, a fifth transistor, and a sixth transistor, a gate contact of the fifth transistor coupling to a first internal node, a source contact of each of the first, third, and fifth transistors coupling to the pumped supply voltage, a source contact of the second and fourth transistors coupling to the common voltage supply, a seventh transistor and an eighth transistor forming a series-connected signal path with the sixth transistor, between the driver-gate node and a second internal node, a gate of each of the sixth, seventh, and eighth transistors coupling to separate row address nodes so that these transistors form a logic gate decoding a plurality of signals on the row address nodes, three transistors comprising the logic gate as described but more or fewer transistors possibly being used to decode more or fewer signals, the sixth transistor being coupled to the driver-gate node, and to a first trapped node, the seventh transistor being coupled to the first trapped node and to a second trapped node, the eighth transistor being coupled between the second trapped node and to the second internal node, a ninth transistor having a source contact coupled to the first trapped node, a drain contact coupled to the chip supply voltage, and a gate contact coupled to the second internal node, a tenth transistor having a source contact coupled to the second trapped node, a drain contact coupled to the chip supply voltage, and a gate contact coupled to the second internal node, an eleventh transistor having a drain contact coupled to the second internal node, a gate contact coupled to a section node, and a source contact coupled to the common supply voltage, a twelfth transistor having a drain contact coupled to the chip supply voltage, a gate contact coupled to a third internal node, and a source contact coupled to the second internal node, a thirteenth transistor and a fourteenth transistor each having a source contact coupled to the pumped voltage supply, the fourteenth transistor and a fifteenth transistor each having a drain contact coupled to the first internal node, the first internal node also coupling to a gate contact of the thirteenth transistor, a drain of a sixteenth transistor and a drain of the thirteenth transistor coupling to the third internal node, the third internal node also coupling to a gate of the fourteenth transistor; the fifteenth transistor and the sixteenth transistor each having a source contact coupled to the common supply voltage, a gate contact of the sixteenth transistor being coupled to the section node, a gate of the fifteenth transistor being coupled to an output of an inverter, and an input of the inverter being coupled to the section node.

\* \* \* \* \*